US010686376B1

(12) United States Patent
Guo et al.

(10) Patent No.: US 10,686,376 B1
(45) Date of Patent: Jun. 16, 2020

(54) METHOD AND SYSTEM FOR CONTROL OF TUNABLE PASSIVE COMPONENT BASED POWER FILTERS

(71) Applicant: Hamilton Sundstrand Corporation, Charlotte, NC (US)

(72) Inventors: Ben Guo, West Hartford, CT (US); Suman Dwari, Vernon, CT (US)

(73) Assignee: HAMILTON SUNSTRAND CORPORATION, Charlotte, NC (US)

(*) Notice: Subject to any disclaimer, the term of this patent is extended or adjusted under 35 U.S.C. 154(b) by 0 days.

(21) Appl. No.: 16/403,944

(22) Filed: May 6, 2019

(51) Int. Cl.
*H02M 3/158* (2006.01)
*H02M 1/14* (2006.01)
*H03J 1/00* (2006.01)

(52) U.S. Cl.
CPC ........... *H02M 3/158* (2013.01); *H02M 1/14* (2013.01); *H03J 1/0008* (2013.01)

(58) Field of Classification Search
CPC .... H03J 1/0008; H03J 1/06; H03J 1/18; H03J 1/20; H02M 1/08; H02M 1/14; H02M 3/156; H02M 3/158; H02M 2001/156; H02M 2001/158
See application file for complete search history.

(56) References Cited

U.S. PATENT DOCUMENTS

| | | | | |
|---|---|---|---|---|
| 5,568,042 A * | 10/1996 | Nyberg | ..................... | H02J 1/02 323/211 |
| 7,738,933 B2 | 6/2010 | Shih et al. | | |
| 8,351,885 B2 * | 1/2013 | Dubash | ..................... | H04B 1/28 323/316 |
| 8,447,275 B2 * | 5/2013 | Dearborn | ............ | H02M 3/1588 323/282 |
| 9,960,723 B2 | 5/2018 | Zhang et al. | | |
| 10,110,140 B1 | 10/2018 | Nanut | | |
| 2018/0131267 A1 * | 5/2018 | Limjoco | .............. | H03H 7/0115 |
| 2019/0074776 A1 | 3/2019 | Tian | | |

FOREIGN PATENT DOCUMENTS

WO    WO-8501844 A1 *    4/1985    ........ H02M 7/53803

* cited by examiner

*Primary Examiner* — Matthew V Nguyen
(74) *Attorney, Agent, or Firm* — Cantor Colburn LLP

(57) ABSTRACT

A method of controlling a tunable passive component in a pulse width modulation controlled switched mode power supply (SMPS) having a power input and an output with tunable passive component power filter. The method includes operably connecting and supplying power relative to a circuit ground to a DC bus, converting a voltage on the DC bus to an output voltage by operating a first switching device and a second switching device at a selected frequency, and filtering the output voltage with a tunable output filter, the tunable output filter including a tunable passive component responsive to a control function circuit configured to automatically tune the tunable passive component value based on a voltage associated with operation of the power supply to maintain resonance of the tunable output filter at about the selected frequency.

20 Claims, 4 Drawing Sheets

METHOD AND SYSTEM FOR CONTROL OF TUNABLE PASSIVE COMPONENT BASED POWER FILTERS

STATEMENT OF FEDERAL SUPPORT

This invention was made with government support under W911NF-16-2-0010 awarded by DARPA. The government has certain rights in the invention.

BACKGROUND

The present disclosure relates generally to passive power filters and, more particularly, to passive LC filter components circuits such as employed in pulse-width modulated (PWM) drives and power converters.

Switched mode DC to DC converter power supplies are widely used to convert power from a source, such as mains power, to DC power supply for electronic devices. Switched mode DC to DC converters generally include buck, boost, buck-boost, fly-back, push-pull and forward converter topologies. In such cases, the DC to DC converter commonly employ large passive components for filtering of switching voltage and current ripple to provide the DC output voltage or current with ripple and noise levels within acceptable thresholds.

In some power electronic converters, resonant filters with narrow-band high attenuation (high Q) at the PWM switching frequency of the converter can be significantly smaller than the conventional low-pass filters which are generally employed for filtering noise and ripple. In order to reduce the filter loss and achieve high attenuation, the quality factor of such resonant filter tank is usually set to be high. As such, the effective bandwidth is very narrow and centered around the switching or PWM frequency. However, in fixed component based resonant filters, due to the variation of filter component values under changing operating conditions, such as varying loads or temperatures, variations of resonant tank inductance or capacitance, the high attenuation at a specific frequency cannot easily be maintained. This in turn, will cause the resonant filter to lose its high attenuation near the frequency of interest, which in turn, degrades its performance.

Accordingly, it is desirable to provide a switched mode power supply or converter output that can successfully achieve high attenuation filtering operation at a target frequency under all various changing conditions.

SUMMARY

According to one embodiment described herein is a switched mode power supply (SMPS) having.

In addition to one or more of the features described above, or as an alternative, further embodiments of the system may include that.

Also described herein is a method of controlling a tunable passive component in a pulse width modulation controlled switched mode power supply (SMPS) having a power input and an output with tunable passive component power filter. The method includes operably connecting and supplying power relative to a circuit ground to a DC bus, converting a voltage on the DC bus to an output voltage by operating a first switching device and a second switching device at a selected frequency, and filtering the output voltage with a tunable output filter, the tunable output filter including a tunable passive component responsive to a control function circuit configured to automatically tune the tunable passive component value based on a voltage associated with operation of the power supply to maintain resonance of the tunable output filter at about the selected frequency.

In addition to one or more of the features described above, or as an alternative, further embodiments of the system may include that the first switching device having a third terminal and the second switching device having a third terminal, wherein the third terminal of the first switching device is connected to a controller and the third terminal of the second switching device of is connected to the controller, the controller operable to implement PWM control at the selected frequency to control a voltage of the output of the power supply.

In addition to one or more of the features described above, or as an alternative, further embodiments of the system may include that the control function circuit configured to automatically tune the passive component value operates independently of the controller implementing PWM control of the first switching device and the second switching device.

In addition to one or more of the features described above, or as an alternative, further embodiments of the system may include that the control function circuit configured to automatically tune the passive component value exhibits a bandwidth that is lower than a bandwidth of the controller implementing PWM control of the first switching device and the second switching device.

In addition to one or more of the features described above, or as an alternative, further embodiments of the system may include that the control function circuit includes at least a detector operable to sense a voltage applied to the tunable component, a controller operable to formulate a bias voltage based at least in part on the voltage applied to the tunable passive component, and a driver configured apply a voltage to the first control input and a second control input of the tunable passive component based on the bias voltage to automatically tune the tunable passive component value.

In addition to one or more of the features described above, or as an alternative, further embodiments of the system may include that the control function circuit includes a controller implementing a proportional-integral control to formulate the bias voltage and thereby tune the tunable passive component value.

In addition to one or more of the features described above, or as an alternative, further embodiments of the system may include a capacitor having a first terminal and a second terminal, the first terminal operably to the output of the power supply and the second terminal connected to ground, wherein the capacitor provides at least one of voltage filtering, voltage stability, ripple reduction and improved hold up time for the voltage or current supplied to the output.

In addition to one or more of the features described above, or as an alternative, further embodiments of the system may include that at least one of the first switching device and the second switching device is at least one of a metal-oxide-semiconductor field-effect transistor (MOSFET), a FET, a bipolar junction transistor, and an insulated gate bipolar transistor.

In addition to one or more of the features described above, or as an alternative, further embodiments of the system may include a tunable input filter configured responsive to a voltage of the input power and the voltage associated with the DC bus.

In addition to one or more of the features described above, or as an alternative, further embodiments of the system may include that the tunable input filter including a third inductor having a first terminal and a second terminal, the first terminal operably connected to the DC bus, a fourth inductor in series with the third inductor having a first terminal and a second terminal, the first terminal of the fourth inductor operably connected to the second terminal of the third inductor, the second terminal of the fourth inductor operably connected to first terminal of the first switching device, a second tunable passive component connected in parallel with the fourth inductor with a first terminal connected to the first terminal of the fourth inductor and a second terminal connected to the second terminal of the fourth inductor, the second tunable passive component having a first control input and a second control input and a second control function circuit operably connected to the first control input and a second control input, the second control function circuit configured to automatically tune the passive component value based on a voltage associated with the DC bus.

Also described herein, in another embodiment is a method of controlling a tunable passive component in a PWM controlled switched mode power supply (SMPS) having a power input and an output with tunable passive component power filter. The methods includes operably connecting and supplying power relative to a circuit ground to a DC bus, converting a voltage on the DC bus to an output voltage by operating a first switching device and a second switching device at a selected frequency, and filtering the output voltage with a tunable output filter, the tunable output filter including a tunable passive component responsive to a control function circuit configured to automatically tune the tunable passive component value based on a voltage associated with operation of the power supply to maintain resonance of the tunable output filter at about the selected frequency.

In addition to one or more of the features described above, or as an alternative, further embodiments of the method may include implementing a PWM control at the selected frequency to control a voltage of the output of the power supply with the first switching device.

In addition to one or more of the features described above, or as an alternative, further embodiments of the method may include operating the control function circuit configured to automatically tune the passive component independently of the controller implementing PWM control of the first switching device and the second switching device.

In addition to one or more of the features described above, or as an alternative, further embodiments of the method may include configuring the control function circuit configured to automatically tune the passive component value with a bandwidth that is lower than a bandwidth of the controller implementing PWM control of the first switching device and the second switching device.

In addition to one or more of the features described above, or as an alternative, further embodiments of the method may include detecting a voltage applied to the tunable passive component, formulating a bias voltage based at least in part on the voltage applied to the tunable passive component, and applying a voltage to control the tunable passive component based on the bias voltage to automatically tune the tunable passive component value.

In addition to one or more of the features described above, or as an alternative, further embodiments of the method may include implementing a proportional-integral control in the control function circuit to formulate the bias voltage and thereby tune the tunable passive component value.

In addition to one or more of the features described above, or as an alternative, further embodiments of the method may include filtering the output voltage with a capacitor, wherein the capacitor provides at least one of voltage filtering, voltage stability, ripple reduction and improved hold up time for the voltage or current supplied to the output.

In addition to one or more of the features described above, or as an alternative, further embodiments of the method may include filtering the input voltage with a tunable input filter responsive to a voltage of the input power and the voltage associated with the DC bus.

In addition to one or more of the features described above, or as an alternative, further embodiments of the method may include filtering the input voltage with a tunable input filter, the tunable input filter including a second tunable passive component responsive to a second control function circuit configured to automatically tune the tunable passive component value based on a voltage associated with the DC bus.

Also described herein in yet another embodiment is a switched mode power supply (SMPS) having a power input and an output with tunable passive component power filter. The SMPS including a DC bus supplied by an power input relative to a circuit ground, an input filter device operable to stabilize the DC bus, and a first switching device operably connected to the DC bus. The SMPS also includes a second switching device operably connected to the first switching device and the circuit ground, the first switching device and the second switching device operable at a selected frequency to generate an output voltage of the power supply and a tunable output filter having a tunable passive component operably connected to the tunable passive component, the control function circuit configured to automatically tune the tunable passive component value based on a voltage associated with operation of the power supply to maintain resonance of the tunable output filter at about the selected frequency.

Additional features and advantages are realized through the techniques of the present disclosure. Other embodiments and aspects of the disclosure are described in detail herein and are considered a part of the claimed disclosure. For a better understanding of the disclosure with the advantages and the features, refer to the description.

BRIEF DESCRIPTION OF THE DRAWINGS

The subject matter, which is regarded as the disclosure, is particularly pointed out and distinctly claimed in the claims at the conclusion of the specification. The foregoing and other features and advantages of the disclosure are apparent from the following detailed description taken in conjunction with the accompanying drawings, in which:

DETAILED DESCRIPTION

Figure 1:
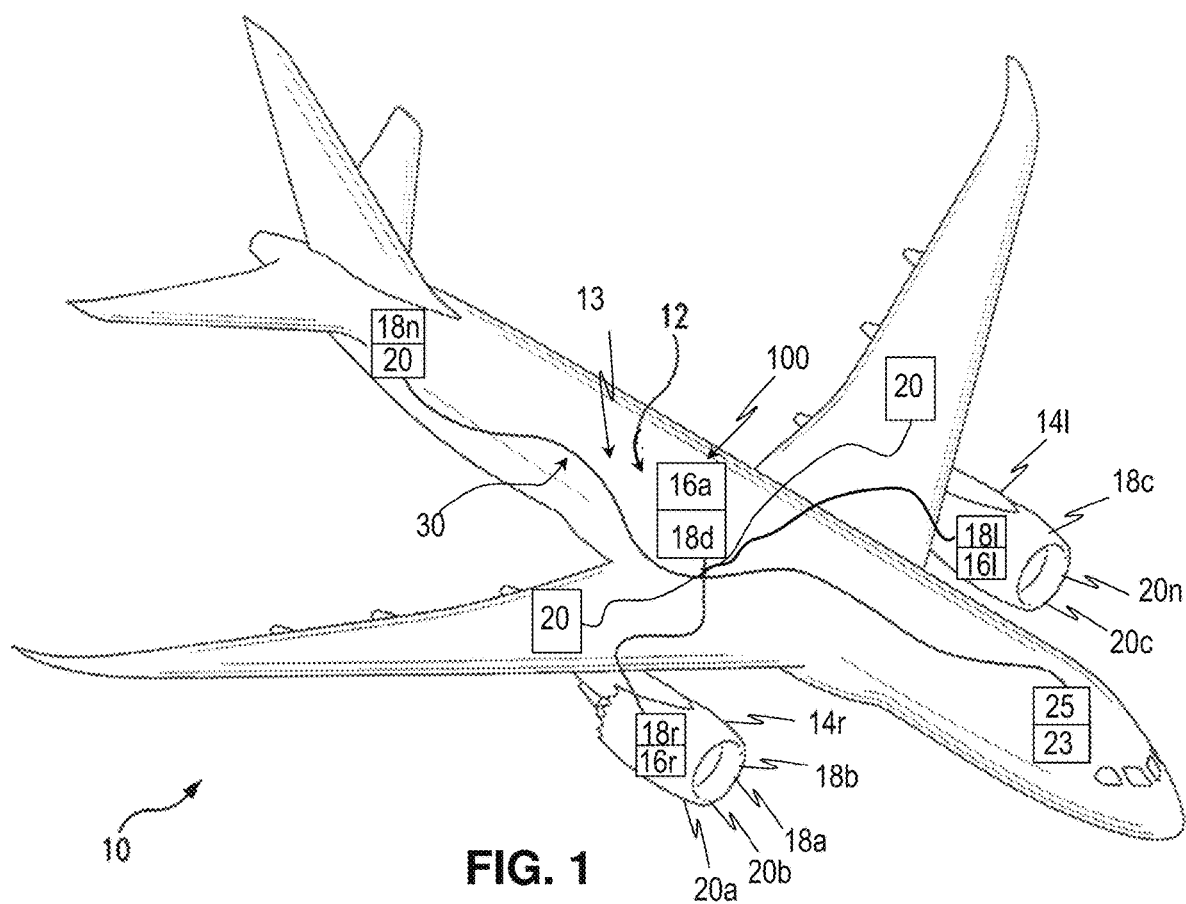
FIG. 1 depicts an example of an aircraft with controller and electrical power systems in accordance with an exemplary embodiment.

For the purposes of promoting an understanding of the principles of the present disclosure, reference will now be made to the embodiments illustrated in the drawings, and specific language will be used to describe the same. It should nevertheless be understood that no limitation of the scope of this disclosure is thereby intended. The following description is merely illustrative in nature and is not intended to limit the present disclosure, its application or uses. It should be understood that throughout the drawings, corresponding reference numerals indicate like or corresponding parts and features. As used herein, the term controller refers to processing circuitry that may include an application specific integrated circuit (ASIC), an electronic circuit, an electronic processor (shared, dedicated, or group) and memory that executes one or more software or firmware programs, a combinational logic circuit, and/or other suitable interfaces and components that provide the described functionality.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and/or a direct "connection".

In general, embodiments herein relate to an application of a dc-dc converter technique that overcomes the losses incurred as a result of the snubber circuit and reduces power loss in power sensitive or higher efficiency applications such as in an airborne environment.

The described embodiments are is explained with an embodiment of flyback/forward DC-DC converters, which produces buck and boost topology output with a resonant tunable output voltage filter. While the embodiments herein are describe with reference to a flyback and forward converter DC-to DC converter topology, the embodiments may readily be applied to DC to DC converters with step-up and step-down configurations as well as AC to DC converters in switched mode PWM controlled applications. The described embodiments are directed by way of example to converter topology with an integrated controller for tunable passive component based (capacitor or inductor) resonant filters. The controller can automatically tune the passive component value (e.g., capacitor value) to achieve the desired performances under varying operating conditions. The controller integrates the sensing, feed-back, PI controller and driver into a single operational amplifier, which greatly reduce the size and power consumption. The tunable resonant filter for a power converter as described herein can successfully achieve high attenuation filtering operation at a target frequency under a wide variety of changing operating conditions. Such very high attenuation capability at specific frequency is very beneficial to design filter component of significantly much lower values. This allows to significantly reduce the filter component size, reduce the losses, and improve the dynamic performances of the system.

Referring to FIG. 1, an aircraft 10 is shown. Aircraft 10 includes one or more control systems shown generally as 12. The control system 12 may include a power system 13 that interconnects with one or more controllers referred to generally as 16 and more specifically as 16l, 16r commonly located at or near each engine 14l, 14r. Other controllers 16 are also be depicted in this instance as 16a, 16b, and the like. In the described embodiments, the reference numerals are annotated with an "l" or "r" to denote the left or right side of the aircraft 10, respectively, for the purpose of simplicity of description. Likewise, the annotation "a", "b", . . . "n" is employed to simplify designation of a multiple enumeration of a component or element.

Each of the controllers 16 may be configured to receive various sensor signals from sensors referred to generally as 18 and individually as 18a, 18b, . . . 18n all over the aircraft 10 and may also operate one or more actuators shown generally as 20, and more specifically as 20a, 20b, 20c, . . . 20n to control the operation of the engines 14r, 14l, flight controls, (not shown), power systems 13 and the like. The control system 12 and power system 13 may also be operably connected to various other components throughout the aircraft 10, including, but not limited to other controllers 16, control panels 23, displays 25, and the like.

Some controllers 16 e.g., 16a may also be configured to receive power from various aircraft sources, e.g., generators, batteries and the like and distribute power as needed to various systems in the aircraft 10 The power system 13 may be part of a controller 16. In yet another embodiment, the configuration could be the opposite with the controller 16 operating as or providing a portion of the power system 13, as illustrated by the general depiction of 16a and described further herein. In an embodiment, the power system 13 includes a power supply (or converter) 100 hereinafter referred to as a power supply 100 as described herein for receiving power from a bus system, converting and routing power to various components in the aircraft 10. In an embodiment, a power supply 100 may be a single or three-phase AC to DC converter, or it could be a DC to DC converter. In one embodiment, and as described by way of example herein, the power supply 100 is a DC to DC converter.

Figure 2A:
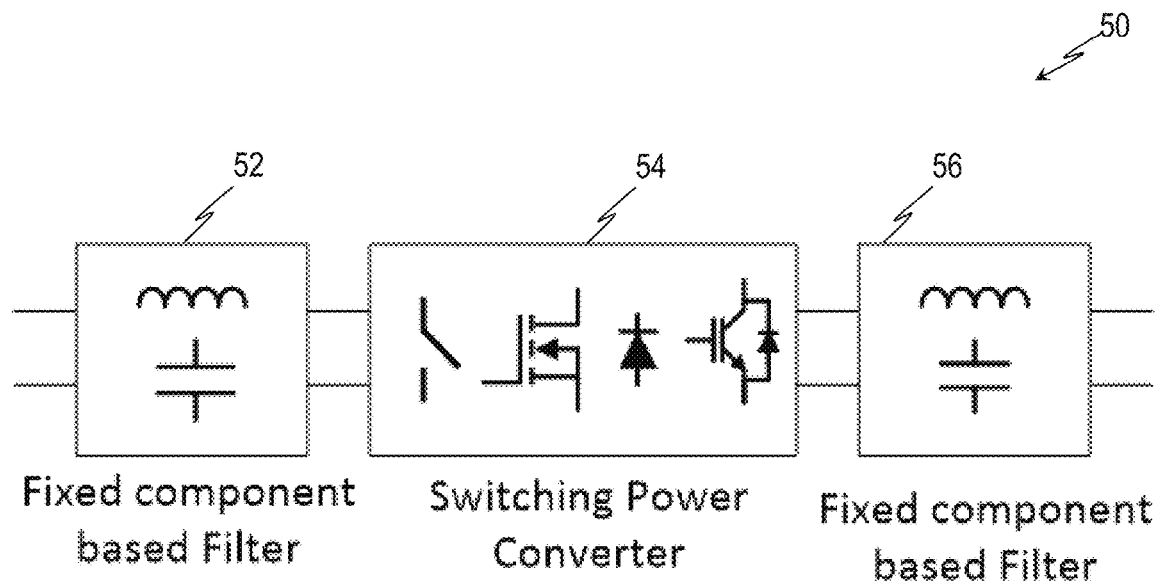
FIG. 2A depicts a simplified block diagram of a power supply with input and output filters.

FIG. 2A depicts a simplified block diagram of a switching power converter or power supply 50. The switching power supply 50 may include an input filter section 52, switching converter section 54, and an output filter section 56. The filter sections may be fully passive, typically low-pass or resonant circuits.

Figure 2B:
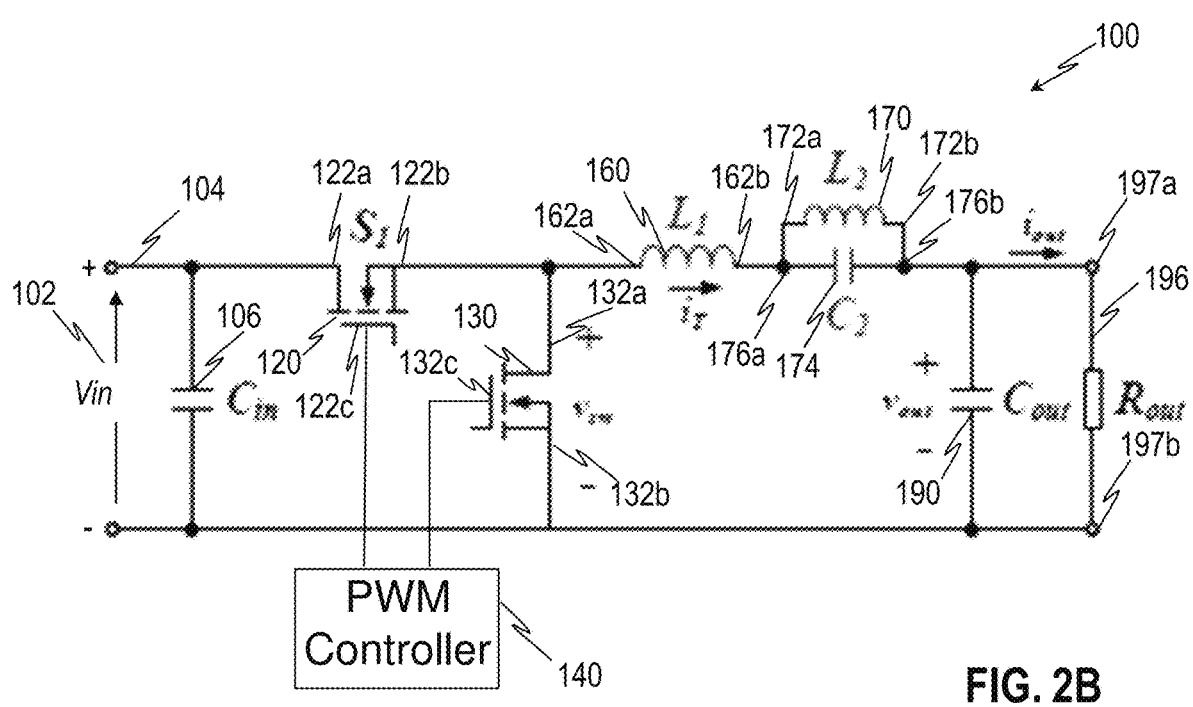
FIG. 2B depicts a simplified schematic diagram of a power supply with input and output filters.

FIG. 2B depicts a more detailed example of a portion of a power supply 100 in a flyback or forward converters DC to DC configuration. The topology of the power supply facilitates producing buck and boost DC outputs, though in the topology depicted a buck converter is shown for example. The power supply 100 receives power at a power input 102 from a power source and a DC bus 104 supported by a filter capacitor 106. The power supply 100 employs at least a first switching device 120. A first terminal 122a of the first switching device 120 is connected to the DC bus 104 and a second terminal 122b connected to a first terminal 132a of the second switching device 130. A second terminal 132b of the second switching device 130 is connected to ground.

In an embodiment the first switching device 122 and the second switching device 132 are MOSFETS, however other kinds of semiconductor switches are possible including transistors, BJT, IGBT, FETS, and the like. A third terminal 122c of the first switching device 120 is connected to a control circuit 140, and a third terminal 132c of the second switching device is connected to the control circuit 140 for implementing PWM control to control the output voltage of the power supply 100. The power supply 100 also includes. The second terminal 122b of the first switching device 120 and the first terminal 132a of the second switching device 130 is connected to a first terminal 162a of inductor 160 while the second terminal 162b is connected to the first terminal 172a of a second inductor 170. The second terminal 172b of the second inductor 170 is connect to the output 196 of the power supply 100.

A capacitor 172 (C2) is connected in parallel with the second inductor 170 with a first terminal 176a connected to the first terminal 172a of the second inductor 170 and the second terminal 176b connected to the second terminal 172b of the second inductor 170 and thereby the output 196. Inductor 170 and capacitor 174 establish a resonant tank circuit. It should be appreciated that while FIG. 2B shows specific configuration of such resonant filters as a parallel combination of inductor 170 and capacitor 174 many other combinations are possible. For example the resonant circuit can be realized in other combinations, such as in series resonance and with a larger number of components and tunable components. An output capacitor 190 is connected across the output 196 and provides filtering and stabilization of the load voltage. The output capacitor 190 has a first terminal 192a connected to the positive terminal 197a of the output of the power supply 100 and a second terminal 197b of the output capacitor 190 is connected to ground (or at least the lower potential terminal 199b of the output 196.

Figure 3A:
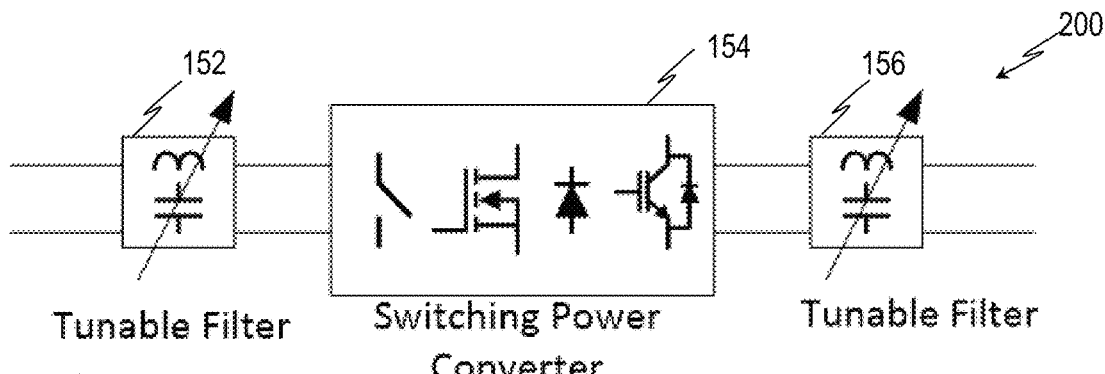
FIG. 3A depicts a simplified block diagram of a power supply with tunable passive filters in accordance with an embodiment.

FIG. 3A depicts a simplified block diagram of a switching power converter or power supply 200 in accordance with an embodiment. In this instance, the switching power converter or power supply 200 may include a input filter section 152, switching converter section 154, and a output filter section 156. The input filter section 152 and the output filter section 156 may be configured as tunable filter sections in one embodiment and may be implemented as resonant circuits having a tunable component in accordance with an embodiment. It should be appreciated that while in the described embodiments are directed to the details of a output filter 156, they are equally applicable to the tunable input filter 152 where the controls are based on the input voltage and the voltage on the DC bus.

Figure 3B:
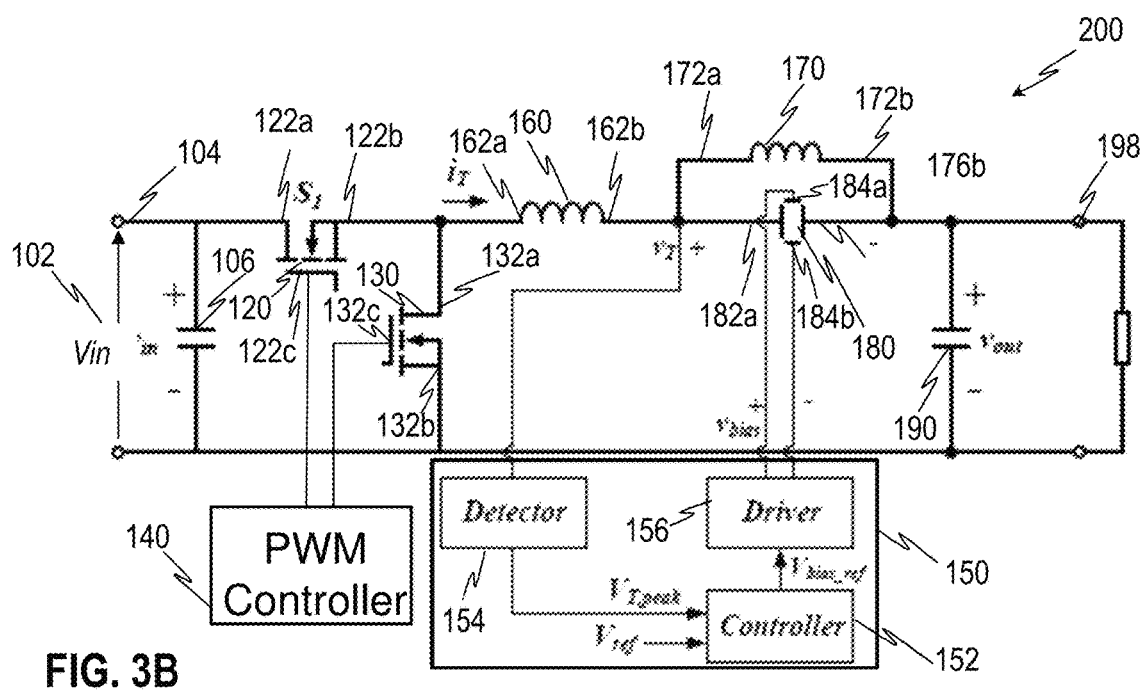
FIG. 3B depicts a simplified schematic diagram of a power supply with tunable passive filters in accordance with an embodiment.

With reference now to FIG. 3B, which depicts a more detailed example of a portion of a power supply 200 and a description of the power supply 200 with the tunable variable reactance in accordance with an embodiment. The topology of the power supply is similar to the power supply 100 except as described herein and facilitates producing buck and boost DC outputs, though in the topology depicted a buck converter is shown for example. The power supply 200 receives input power from a power source at a power input 102 and a DC bus 104 supported by a filter capacitor 106. The power supply 200 employs at least a first switching device 120. A first terminal 122a of the first switching device 120 is connected to the DC bus 104 and a second terminal 122b connected to a first terminal 132a of the second switching device 130. A second terminal 132b of the second switching device 130 is connected to ground.

In an embodiment the first switching device 122 and the second switching device 132 are MOSFETS, however other kinds of semiconductor switches are possible including transistors, BJT, IGBT, FETS, and the like. A third terminal 122c of the first switching device 120 is connected to a control circuit 140, and a third terminal 132c of the second switching device is connected to the control circuit 140 for implementing PWM control to control the output voltage of the power supply 200. The second terminal 122b of the first switching device 120 and the first terminal 132a of the second switching device 130 is connected to a first terminal 162a of inductor 160 while the second terminal 162b is connected to the first terminal 172a of a second inductor 170. The second terminal 172b of the second inductor 170 is connect to the output 196 of the power supply 200.

A tunable passive component 180 is connected in parallel with the second inductor 170 with a first control terminal 182a connected to the first terminal 172a of the second inductor 170 and a second control terminal 182b connected to the second terminal 172b of the second inductor 170 and thereby the output 196. Tunable passive component 180 also includes a first control input 184a and a second control input 184b operably connected to a control function circuit 150. In an embodiment the tunable passive component 180 could be a variable capacitor or a variable inductor. In the example of a tunable capacitor, the capacitance varies as a function of the bias voltage applied between the first control terminal 182a and the second control terminal 182b. In one example, the value of the capacitance can be tuned over arrange of about 100% to 50%, for a range of 0% to 100% bias voltage, though other values and ranges are possible.

In an embodiment, the control function circuit 150 includes a controller 153 executing a control law for controlling the variable capacitor 180 and a detector 155 for sensing the voltage applied to the tunable passive component 180. The control function circuit 150 also includes a driver 158 operably connected to the controller 153 and the first control input 184a and the second control input 184b of the tunable passive component 180. The tunable passive component 180 is a variable capacitor in one embodiment. Details of the operation of the control function circuit 150 and the controller 152 are provided herein. An output capacitor 190 is connected across the output 196 and provides filtering and stabilization of the load voltage. The output capacitor 190 has a first terminal 192a connected to the positive terminal 199a of the output of the power supply 100 and a second terminal 192b of the output capacitor 190 is connected to ground (or at least the lower potential terminal 199b of the output 196.

Figure 4:
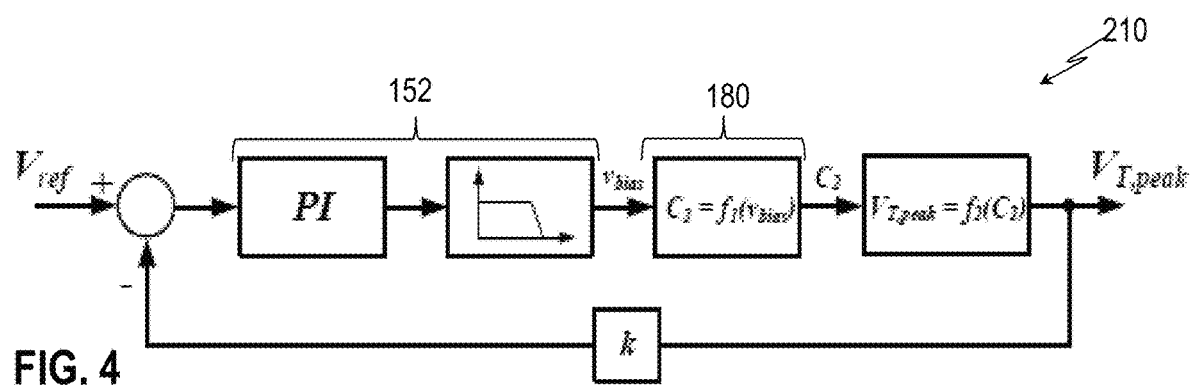
FIG. 4 depicts a simplified block diagram of a control function circuit for the power supply in accordance with an embodiment.

With reference now to FIGS. 3 and 4, the control function circuit 150 includes an integrated controller 152 for the tunable passive component 180 based (e.g., capacitor or inductor) resonant filters. The controller 153 can automatically tune the passive component 180 value (e.g. capacitor value) to achieve the desired performances under varying operating conditions.

In an embodiment the control function circuit 150 employs detector 155 for sensing voltages and/or currents, a controller 153 implemented as a proportional-integral (PI) controller and a driver 158 configured to interface to the tunable passive component 180 (whether a variable capacitor or variable inductor). In practice, the detector 155, controller 153, and driver 158 may all be integrated into a single amplifier, which greatly reduces size and power consumption.

In an embodiment, the peak of the tank voltage, denoted VTpk, can be utilized as a feedback parameter as an indicator of the resonant tank operation and is sensed by the detector 155. The error between a reference voltage and the sensed tank voltage peak is provided as input to the controller 153 for estimation of a reference bias voltage, denoted vbias_ref that is required for actively tuning the tunable passive component 180, (e.g., a resonant tank capacitor). The controller 153 output is provided to a driver stage 158 for driving the tunable passive component 180 (e.g., a tunable capacitor) with a bias signal vbias. It should be appreciated that while a PI controller is described for the operation of the controller 153, such description is merely illustrative and should not be considered limiting. Other control topologies are possible and envisioned including, but not limited to, proportional, proportional-derivative, and proportional-integral-derivative.

The control diagram in FIG. 4 may operate independently from the main controller (for controlling the power supply (not shown)) by utilizing simple but robust PI controller 153 based scheme. The bandwidth of the control scheme for active tuning may, in one embodiment, be lower than the main controller of the power supply 200 to avoid any potential interference but it is selected to be fast enough to compensate the slow component variation in the resonant tank components i.e., the tunable passive component 180.

Implementing the control scheme of FIG. 4 in the circuit of FIG. 3 (e.g., in control function circuit 150) may achieve high attenuation filtering operation at a target frequency under various changing operating conditions. Such high attenuation capability at specific frequencies is very beneficial to facilitate design of filter components of significantly lower values. As such, this variable resonant filter approach facilitates use of significantly reduced the filter component sizes, exhibiting reduced losses and improves the dynamic performances of the converter/power supply 200.

In operation, employing the active tuning control and tunable components of the described embodiments, a reduction in filter size or the output ripple (with similar components) of the converter/power supply 200 of more than 50% can be achieved versus a conventional LC low pass passive filter. Further, the control system implementing the control methodology/circuits described herein can maintain filtering performance over step load changes from full load to a light load (e.g. less than 40% load) as well as other operating conditions that would result in changes in characteristics of the passive components. The load step change in the operation was limited by the tunability of the resonant tank components; otherwise it is found that, the active tuning control can successfully maintain the filter performance over the full load range and broad range variations of the load and environmental conditions.

Figure 5:
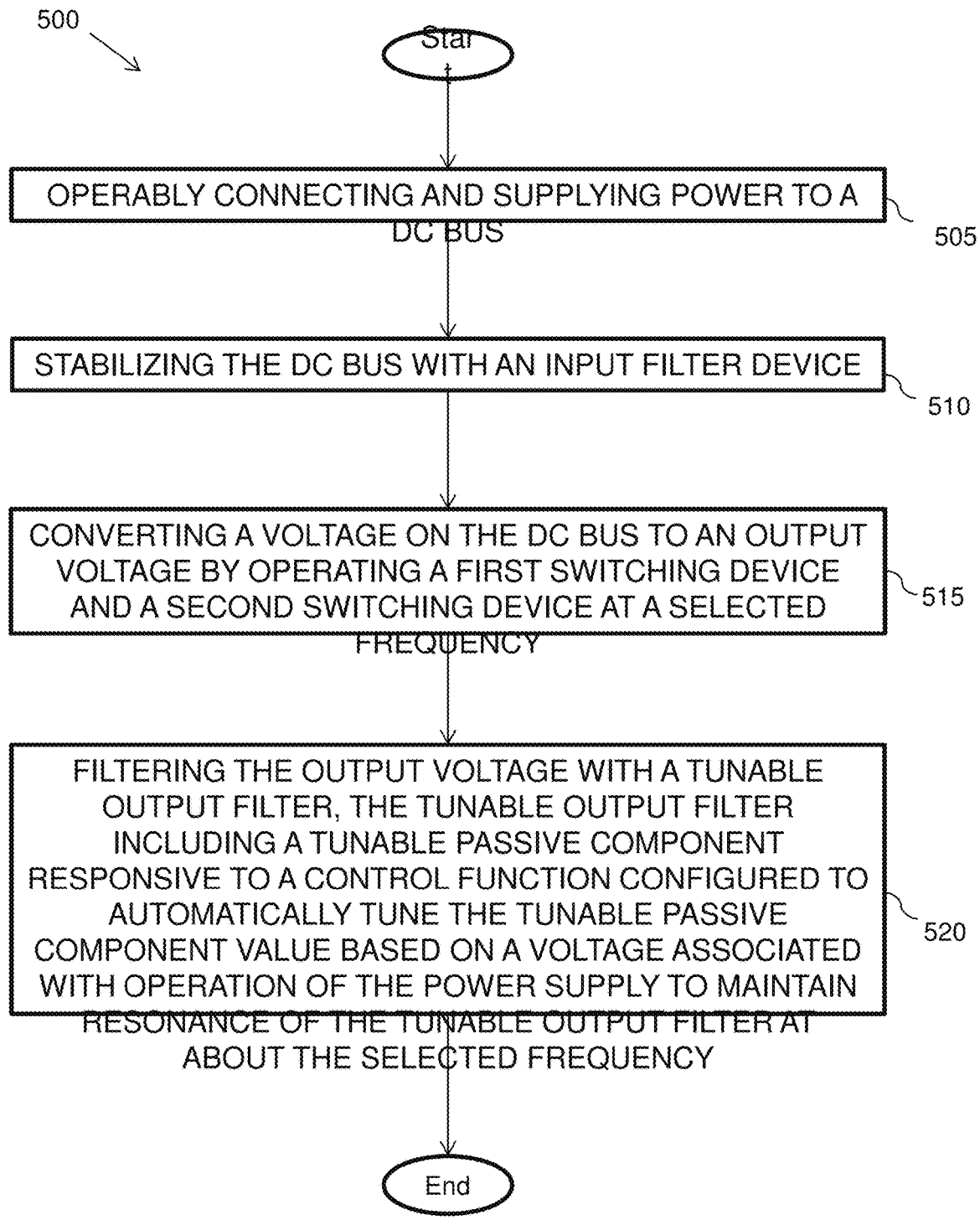
FIG. 5 depicts a simplified flowchart of the method of controlling a tunable passive component filter in accordance with an embodiment.

Turning now to FIG. 5 as well, a block diagram is shown to provide a description of a method 500 of controlling a tunable passive component 180 in a PWM controlled a switched mode power supply (SMPS) 200 having a power input 102 and an output 196 with tunable passive component power filter 156 (FIG. 3A). The method 500 initiates a process block 505 with operably connecting and supplying power relative to a circuit ground to a DC bus 104 and stabilizing the DC bus 104 with an input filter device 152 (FIG. 3A), e.g. filter capacitor 106 as depicted at process block 510. The method 500 also includes converting a voltage on the DC bus 104 to an output voltage by operating a first switching device 120 and a second switching device 130 at a selected frequency as depicted at process block 515. Further, at process block 520 the method 500 includes filtering the output voltage with a tunable output filter 156, the tunable output filter 156 including a tunable passive component 180 responsive to a control function circuit 150 configured to automatically tune the value of the tunable passive component 180 based on a voltage associated with operation of the power supply 200 to maintain resonance of the tunable output filter 156 at about the selected frequency.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more features, integers, steps, operations, element components, and/or groups thereof. For the purposes of this disclosure, it is further understood that the terms "inboard" and "outboard" can be used interchangeably, unless context dictates otherwise.

While the present disclosure has been described in detail in connection with only a limited number of embodiments, it should be readily understood that the present disclosure is not limited to such disclosed embodiments. Rather, the present disclosure can be modified to incorporate any number of variations, alterations, substitutions, combinations, sub-combinations, or equivalent arrangements not heretofore described, but which are commensurate with the scope of the present disclosure. Additionally, while various embodiments of the present disclosure have been described, it is to be understood that aspects of the present disclosure may include only some of the described embodiments.

What is claimed is:

1. A switched mode power supply (SMPS) having a power input and an output with tunable passive component power filter comprising:
   a DC bus supplied by an power input relative to a circuit ground;
   an input filter device operable to stabilize the DC bus;
   a first switching device having a first terminal, a second terminal and a control terminal, the first terminal of the first switching device connected to the DC bus;
   a second switching device having a first terminal, a second terminal and a control terminal, the first terminal of the second switching device connected to the second terminal of the first switching device and the second terminal of the second switching device connected to the circuit ground, the first switching device and the second switching device operable at a selected frequency; and
   an output filter comprising a first inductor having a first terminal and a second terminal, the first terminal operably connected to the second terminal of the first switching device and the first terminal of the second switching device;
   a tunable output filter comprising:
      a second inductor in series with the first inductor having a first terminal and a second terminal, the first terminal of the second inductor operably connected to the second terminal of the first inductor, the second terminal of the second inductor operably connected to the output of the power supply;
      a tunable passive component connected in parallel with the second inductor with a first terminal connected to the first terminal of the second inductor and a second terminal connected to the second terminal of the second inductor, the tunable passive component having a first control input and a second control input; and
      a control function circuit operably connected to the first control input and a second control input, the control function circuit configured to automatically tune a passive component value of the passive component based on a voltage associated with operation of the power supply to maintain resonance of the tunable output filter at about the selected frequency.

2. The SMPS of claim 1, wherein:
the first switching device has a third terminal and the second switching device has a third terminal, the third terminal of the first switching device is connected to a controller and the third terminal of the second switching device of is connected to the controller, and the controller implements PWM control at the selected frequency to control a voltage of the output of the power supply.

3. The SMPS of claim 2, wherein the control function circuit configured to automatically tune the passive component value operates independently of the controller implementing PWM control of the first switching device and the second switching device.

4. The SMPS of claim 2, wherein the control function circuit configured to automatically tune the passive component value exhibits a bandwidth that is lower than a bandwidth of the controller implementing PWM control of the first switching device and the second switching device.

5. The SMPS of claim 2, wherein the control function circuit includes at least a detector operable to sense a voltage applied to the tunable component, a controller operable to formulate a bias voltage based at least in part on the voltage applied to the tunable passive component, and a driver configured apply a voltage to the first control input and a second control input of the tunable passive component based on the bias voltage to automatically tune the tunable passive component value.

6. The SMPS of claim 5, wherein the control function circuit includes a controller implementing a proportional-integral control to formulate the bias voltage and thereby tune the tunable passive component value.

7. The SMPS of claim 1, further including a capacitor having a first terminal and a second terminal, the first terminal operably to the output of the power supply and the second terminal connected to ground, wherein the capacitor provides at least one of voltage filtering, voltage stability, ripple reduction and improved hold up time for the voltage or current supplied to the output.

8. The SMPS of claim 1, wherein at least one of the first switching device and the second switching device is at least one of a metal-oxide-semiconductor field-effect transistor (MOSFET), a FET, a bipolar junction transistor, and an insulated gate bipolar transistor.

9. The SMPS of claim 1, further including a tunable input filter configured responsive to a voltage of the input power and the voltage associated with the DC bus.

10. The SMPS of claim 1, wherein the tunable input filter comprising:
a third inductor having a first terminal and a second terminal, the first terminal operably connected to the DC bus;
a fourth inductor in series with the third inductor having a first terminal and a second terminal, the first terminal of the fourth inductor operably connected to the second terminal of the third inductor, the second terminal of the fourth inductor operably connected to first terminal of the first switching device;
a second tunable passive component connected in parallel with the fourth inductor with a first terminal connected to the first terminal of the fourth inductor and a second terminal connected to the second terminal of the fourth inductor, the second tunable passive component having a first control input and a second control input; and
a second control function circuit operably connected to the first control input and a second control input, the second control function circuit configured to automatically tune the passive component value based on a voltage associated with the DC bus.

11. A method of controlling a tunable passive component in a PWM controlled switched mode power supply (SMPS) having a power input and an output with tunable passive component power filter comprising:
operably connecting and supplying power relative to a circuit ground to a DC bus;
stabilizing the DC bus with an input filter device;
converting a voltage on the DC bus to an output voltage by operating a first switching device and a second switching device at a selected frequency; and
filtering the output voltage with a tunable output filter, the tunable output filter including a tunable passive component responsive to a control function circuit configured to automatically tune a tunable passive component value of the tunable passive component based on a voltage associated with operation of the power supply to maintain resonance of the tunable output filter at about the selected frequency.

12. The method of controlling a tunable passive component of claim 11, further including implementing a PWM control at the selected frequency to control a voltage of the output of the power supply with the first switching device.

13. The method of controlling a tunable passive component of claim 12, further including operating the control function circuit configured to automatically tune the passive component independently of the controller implementing PWM control of the first switching device and the second switching device.

14. The method of controlling a tunable passive component of claim 12, further including configuring the control function circuit configured to automatically tune the passive component value with a bandwidth that is lower than a bandwidth of the controller implementing PWM control of the first switching device and the second switching device.

15. The method of controlling a tunable passive component of claim 12, further including implementing a proportional-integral control in the control function circuit to formulate the bias voltage and thereby tune the tunable passive component value.

16. The method of controlling a tunable passive component of claim 11, further including:
detecting a voltage applied to the tunable passive component;
formulating a bias voltage based at least in part on the voltage applied to the tunable passive component; and
applying a voltage to control the tunable passive component based on the bias voltage to automatically tune the tunable passive component value.

17. The method of controlling a tunable passive component of claim 11, further including filtering the output voltage with a capacitor, wherein the capacitor provides at least one of voltage filtering, voltage stability, ripple reduction and improved hold up time for the voltage or current supplied to the output.

18. The method of controlling a tunable passive component of claim 11, further including filtering the input voltage with a tunable input filter responsive to a voltage of the input power and the voltage associated with the DC bus.

19. The method of controlling a tunable passive component of claim 11, further including filtering the input voltage with a tunable input filter, the tunable input filter including a second tunable passive component responsive to a second control function circuit configured to automatically tune the tunable passive component value based on a voltage associated with the DC bus.

20. A switched mode power supply (SMPS) having a power input and an output with tunable passive component power filter comprising:
- a DC bus supplied by an power input relative to a circuit ground;
- an input filter device operable to stabilize the DC bus;
- a first switching device operably connected to the DC bus;
- a second switching device operably connected to the first switching device and the circuit ground, the first switching device and the second switching device operable at a selected frequency to generate an output voltage of the power supply; and
- a tunable output filter having a tunable passive component and a control function circuit configured to automatically tune a tunable passive component value of the tunable passive component based on a voltage associated with operation of the power supply to maintain resonance of the tunable output filter at about the selected frequency.

* * * * *